United States Patent [19]

Poerschke et al.

[11] Patent Number: 4,862,134
[45] Date of Patent: Aug. 29, 1989

[54] ELECTRICAL FUSE AND METHOD FOR ITS PRODUCTION

[75] Inventors: Karl Poerschke, Sprockhövel; Klaus Stärk, Witten; Bernd Fröchte, Herne, all of Fed. Rep. of Germany

[73] Assignee: Wickmann Werke GmbH, Fed. Rep. of Germany

[21] Appl. No.: 221,126

[22] Filed: Jul. 19, 1988

[30] Foreign Application Priority Data

Jul. 30, 1987 [DE] Fed. Rep. of Germany ....... 3725280
Dec. 23, 1987 [DE] Fed. Rep. of Germany ....... 3743857

[51] Int. Cl.$^4$ .................... H01H 85/16; H01H 85/04
[52] U.S. Cl. ................................. 337/231; 29/623; 337/290; 337/297; 361/104
[58] Field of Search ................... 337/186–232, 337/295–297, 162, 163, 164, 293, 290; 29/623; 361/104, 402, 410

[56] References Cited

U.S. PATENT DOCUMENTS 4,037,318 7/1977 Burkley et al. ................... 29/623
4,771,260 9/1988 Gurevich ........................... 337/231

Primary Examiner—H. Broome
Attorney, Agent, or Firm—Banner, Birch, McKie and Beckett

[57] ABSTRACT

An electrical fuse comprises a fusible conductor welded or bonded onto separated contact surfaces. The fusible conductor is coated with a metal, selected solely for optimum welding or bonding to contact zones of the contact surfaces. The metallic coating of the fusible conductor is then removed at the fusible portion of the coated fusible conductor by etching after the fusible conductor is welded or bonded to the contact surfaces the contact zones surrounding the point of contact protected by a resin cover resistant to the etchant. The electrical characteristic of the fuse is thus determined soley by the core wire and its properties. The resin cover in the contact zones is preserved between the fusible conductor and each contact surface for improved safety against cracks or micro-cracks and their possible adverse effects.

30 Claims, 2 Drawing Sheets

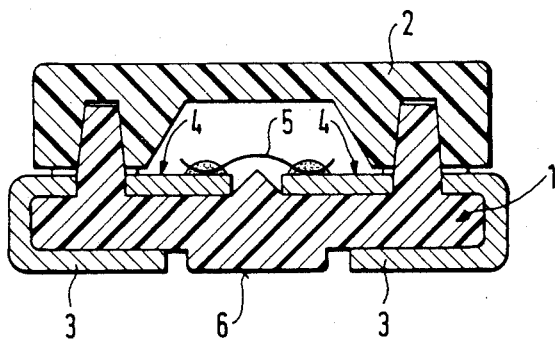
Fig. 1
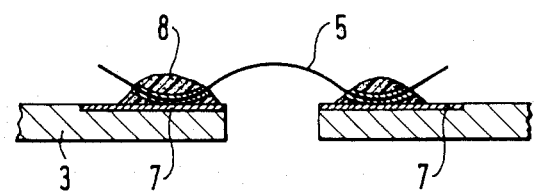
Fig. 2
Fig. 3
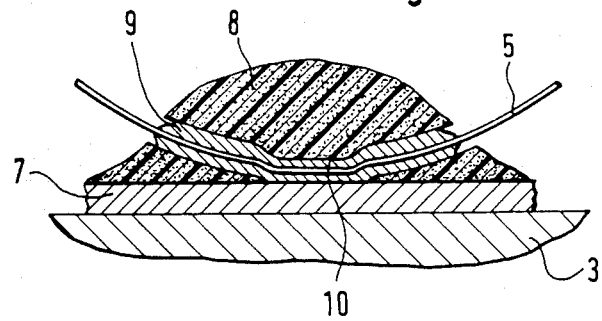

ELECTRICAL FUSE AND METHOD FOR ITS PRODUCTION

BACKGROUND OF THE INVENTION

1. Field of the Invention

The present invention is directed to an electrical fuse and a method for its production having a metallically coated, partially etched fusible conductor welded or bonded onto contact surfaces in its housing.

2. Related Art

The welding or bonding offusible conductors onto contact surfaces in a fuse housing is especially preferred among fuses which are selected to be mounted onto printed circuit boards and the like by the so-called SMD-technique (surface mounted device technique). Conventionally, when mounting a fuse by the SMD-technique, the housing of the fuse is first glued to the printed circuit board. Then, solder for contacting the contact surfaces to the contacts of the printed circuit board and for mounting the fuse onto the printed circuit board is added with the aid of flow-soldering. Alternatively, when the solder is added by the melting of a soldering paste which has been applied earlier, no glueing of the housing is necessary. As a result of the soldering, the fusible conductor in the fuse housing may reach soldering temperatures. The heat can interrupt or otherwise compromise soldered connections in the housing for fixing the fusible conductor to contact surfaces in the housing. From the heat of soldering the housing to a printed circuit board also alloying by diffusion may take place whereby the characteristics of the fuse can be changed and at least an aging of the fuse occurs.

If the connection between the fusible conductor and the contact surfaces is instead accomplished by welding or bonding, these disadvantages resulting from applying heat during the mounting by soldering of the fuse housing onto a printed circuit board are prevented. However, welding or bonding of fusible conductors has its own disadvantages. When welding or bonding, a certain pressure on the fusible conductor and its respective contact surfaces is necessary whereby the fusible conductor and possibly the base material of the contact surfaces (or the plated contact surfaces) more or less deforms. These deformations can lead to cracks, especially micro-cracks, which may spread during loading in use. By each loading of the electrical fuse, the fusible conductor increases and decreases in length when a load is added and removed so that the point of welding or bonding is mechanically stressed by each switching on and off of a unit for which the fuse is used. Micro-cracks are especially difficult to detect initially in a new device because they are fully conductive at the outset and thus undetectable by electrical tests. Even optical tests using a microscope are no guaranty that damage will be detected.

SUMMARY OF THE INVENTION

It is therefore an object of the invention to improve the welded or bonded connection between the fusible conductor and the contact surfaces in an electrical fuse.

It is a further object of the invention to provide an electrical fuse which is well suited for the SMD-technique by using a substrate as a base for the fuse.

It is a further object of the invention to propose a method for producing such a fuse.

The invention comprises a fuse with a fusible conductor which is coated not only in the welding or bonding section but also immediately adjacent to the weld or bond. The method for producing the fuse welds or bonds a fully coated fusible conductor onto contact surfaces. The contact area in the immediate vicinity of the weld or bond forms a contact zone and adjacent areas which are covered by an etch-proof resin cover. Afterwards, the metallic coating on the fusible conductor is etched away the contact zones and the adjacent areas protected by the etch-proof resin cover being left intact.

An unavoidable deformation of the fusible conductor during welding or bonding takes place also with fusible conductors which consist of a core wire and a metallic coating. According to the invention when the etch-proof resin cover covers more than the point of welding or bonding, there is sufficient conduction in the contact zones (despite the deformations) which guarantee that a micro-crack within the contact zone has no effect. For instance, by means of the metallic coating of the fusible conductor, there is a sufficient path of conduction which conducts all electrical currents up to the area covered by the etch-proof resin immediately adjacent to the contact zones without any loss or interruption. From the end of the etch-proof resin cover on one side of the fusible conductor to the end of the etch-proof resin cover on the other side, only a core wire exists having a desired melting characteristic. The ends of the wire are reliably and under all conditions sufficiently electrically connected with their respective contact surfaces.

A metallic coating on fusible conductors is not new per se. Especially its use for influencing the characteristics of fuses. For instance, silver wires are coated by tin envelopes and so forth in order to lower their melting point. This lowers the melting point due to alloy building between the two metals and thus has a modified switch-off characteristic. In the present invention, however, a coating on the fusible conductor is not used for influencing the switch-off characteristic. The coating is used primarily for improving the contact between the core wire of the fusible conductor and respective contact surface. In use, the remaining coating in the finished fuse is separate from the fusible section of the fuse so that the core wire alone is used for determining the switch-off characteristic.

Besides the described advantages of the guaranteed and reliable electrical contact from the first contact surface to the fusible conductor and from the fusible conductor to the second contact surface, there is a further special advantage to this design. Since the material of the metallic coating can be chosen relatively free—without respect to the melting behavior or alloy building with the core wire—a selection for a metal coating is possible only with respect to the welding or bonding properties. Harmonization is especially possible with the basic material of the contact surfaces or with a plating on the contact surfaces which have been brought onto the base material for improving the connection. Since the bonding is a kind of cold press welding with small friction movements, materials suitable for this technique can be used for a possible plating and for the coating of the fusible conductor. Silver is for example, preferable for coating a core wire of gold and nitric acid may be used for etching away the silver within the working section of the fuse wire.

With mass-produced fuses, less expensive coatings and fusible conductors are very much sought after such as coatings made of aluminium alloys and fusible conductors such as copper or silver. An aluminium-silicon alloy having a content of 1% silicon is very suitable for bonding. Furthermore, such an alloy has a sufficient resistance against corrosion due to its self-generated oxide layer. Aluminium and its alloys can be easily etched away with soda lye which does not attack a copper or silver core wire.

There is no disadvantage if during the etching away of the metallic coating outside of the protective resin cover also is etched away. Due to the protective resin cover, before etching a sufficiently large island of untouched material is maintained under the resin which is sufficient to guarantee stable and reliable conduction. Areas of 1 to 3 mm$^2$ are sufficient.

Theoretically the protective resin can be removed after etching. Since the function of the fuse is normally uncompromised, the protective cover may be permitted to remain in the area of the contact between the fusible conductor and the contact surfaces without any disadvantages. The remaining protective coating will even prevent a strong deformation in the contact zones so that preserving the resin intact is advisable.

Bonding tools used today for bonding fusible conductors onto contact surfaces are sensitive to the thickness of the fusible conductor to be processed. If deviations of more than 10 micrometers in the thickness of the type of wire employed occur, a readjustment of the bonding tool is necessary, for example, by retooling. Here, the invention has substantial advantages. Since the thickness of the metallic coating from an electrical point of view is meaningless and only the material of the coating is important for a good bond, fusible conductors having different diameters of core wire but a constant overall thickness including varied thicknesses of metallic coating can be used. In this way the device used for bonding can be used for all fuse types which are manufactured one after the other without retooling, even if the thickness of the metallic coating varies over multiples of 0.05 to 10 times the thickness of the core wire.

It was hereinbefore already explained that bonded or welded fusible wires are advantageous in connection with fuses mounted on a printed circuit board by the SMD-technique (surface mounted device technique). The reason for the preference of a bonded or welded connection lies in the necessity to heat the electrical components during mounting onto the printed circuit under soldering temperatures. A further necessity for this technique is the presence of a soldering surface on the bottom side of the component or at the components lateral sides, both prepared for the flow-soldering method or for the so-called reflow-method in which a soldering paste is applied first.

For perfecting the mounting of the electrical fuse according to the invention, a development is proposed which comprises contact surfaces on a substrate, especially a ceramic substrate. On the side of the substrate opposite the contact surfaces, electrically conductive soldering surfaces are arranged and between one contact surface and a related soldering surface a through-connection is provided. Such a fuse is especially suitable for the reflow-technique.

Instead of soldering surfaces with a through-connection, an edge metallization can be used with an electrically conductive connection to the corresponding contact surface. The edge metallizations are first applied on as pastes and later burnt in under temperatures between 500° and 800° C. Depending on the application for the contact surfaces, the edge metallization can be applied together with the contact surfaces. In mass-production, a substrate strip having a width equal to the length of the fuse is provided. On both sides of the substrate strip edge metallization is formed with two contact surfaces spread from one another. After fabrication of the single fuses on the substrate strip, the substrate strip is broken up or sliced. The seam between two single fuses where the substrate strip is sliced can be provided with at least one hole or an oblong hole which acts as a graded break line.

After slicing the fabricated substrate strip into single fuses the edge metallizations are completely sufficient for flow-soldering. Alternatively, a plate comprising rows and columns of such fuses may be constructed and similarly separated. Preferably the seams between two single fuses where the plate is sliced are provided with at least one hole or an oblong hole which is metallized before or together with the generation of the contact surfaces. The arrangement of holes or oblong holes in the area of the seam lines between singles fuses also has the advantage that at this place a pre-set break point exists which facilitates the separation of the plate into single fuses. After separation of the plate into single fuses the edge metallizations on the sides of the holes are completely sufficient for flow-soldering.

Especially suitable as a substrate for a fuse according to the invention is a ceramic substrate which has, despite its fine structure, a certain roughness on the surface. Surprisingly, it has been found that a ceramic substrate provides an exceptionally good bonding base for a plastic hood or lid which can be thermally welded onto the substrate in order to protect the fusible conductor. Thermoplastic plastics are suitable for the lid which can cope without damage with the short duration heat wave during reflow-soldering or flow-soldering. The plastic lids can be provided with V-shaped or semicircular shaped joining pins or ribs which can be pressed against the substrate under heat treatment forming a weld or joined by other methods such as gluing. The welded ribs strongly deform and build a gas-tight seal.

During the manufacture of plates carrying several copies of the fuse, the application of the plastic hood can also take place before the lids are separated. To assist in separation, the plastic hoods can be provided with little webs or graded break lines at the connection between adjacent lids.

BRIEF DESCRIPTION OF THE DRAWINGS

FIG. 1 shows a cross-sectional view of a fuse according to a first embodiment of the invention for the SMD-technique;

FIG. 2 shows a cross-sectional view showing the fusible conductor area of the fuse according to FIG. 1 or any other fuse;

FIG. 3 shows a cross-sectional view of a preferred fuse contact zone between a fusible conductor and a contact surface;

Figure 4:
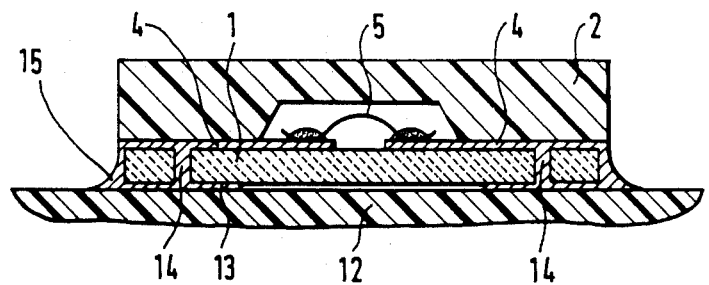
FIG. 4 shows a cross-sectional view according to FIG. 1 of a second embodiment of the invention.

Embodiments of the invention which are shown in the drawings will be explained hereinafter in greater detail.

DESCRIPTION OF THE PREFERRED EMBODIMENTS

In FIG. 1 an electrical fuse is shown according to the invention. It consists of a base 1 of plastic over which a hood or lid 2 is placed after completion of the fuse with the aid of corresponding pins or other means of joining. On both sides of the base 1, conductors 3 are bent U-shaped around the base 1 to form contact surfaces 4 having a distance from each other under the lid 2. The contact surfaces 4 may also be printed on a substrate 1.

Between the contact surfaces 4 a fusible conductor 5 is arranged which is mounted according to the invention. The details of mounting are described later. To aid in mounting the fuse on a printed circuit or on a substrate there is a gluing patch 6 on the outside of the base 1 between the conductors 3.

In FIG. 2 the details of the connection between the fusible conductor 5 and the contact surfaces 4 are shown. In the contact zones there is a metallic plating 7 which is mated to metallic coating 9 (FIG. 3) of the fusible conductor and which is especially from the same material as the metallic coating 9. A section of the contact zone is shown in FIG. 3 and described in greater detail hereinafter.

At first, the two conductors 3, which are held in their intended positions by a not shown bridge which is removed later, are provided with a metallic plating 7 preferably of aluminum. Afterwards, the fusible conductor 5 is brought onto the contact surfaces 4 by welding or bonding. FIG. 3 shows an embodiment exemplifying the connection by bonding. During this process the metallic coated fusible conductor 5 is slightly squeezed within the contact zone so that the metallic material of the coating and the plating make contact to each other and form a connection due to cold-press-welding. A deformed section 10 is clearly discernible in FIG. 3.

Preferably, the core wire of the fusible conductor 5 consists of silver and the metallic coating 9 of aluminum. That way there is a connection in the deformed section 10 between the aluminum of the coating 9 and the aluminum of the plating 7. The rather heavy deformation of the core wire within the deformed section 10 can also be seen in FIG. 3. The deformation has, however, no negative effect.

After the bonding of the fusible conductor 5 onto the plating 7 a drop of etch-proof epoxy resin 8 is placed onto the contact zone. Protection means other than an etchproof epoxy resin may be used such as silicon or a lacquer which is resistible against a soda lye or other suitable etchant. After the completion of the connection at the ends of the fusible conductor 5 the thus prefabricated fuse is immersed into an etch bath of a soda lye etchant. The aluminum of the coating 9 as well as the plating 7 outside of the areas covered by the epoxy resin 8 are removed by the etching. Some undermining caused by etching can be clearly seen in FIG. 3.

After it is determined by tests how much time is needed to completely etch the coating 9 outside of the protected area protected by the epoxy resin 8—a not yet completely removed plating 7 is of no importance—a certain etching time is fixed which may contain another 10% safety supplement for coping with variances. Afterwards the fuse is washed and rinsed and the two conductors 3 are applied to the base 1. Bridges which may have been used to hold the conductors 3 are now removed. Finally, the fuse is ready for use after the lid 2 (FIG. 1) is placed upon the base 1.

As clearly shown in FIG. 3, the contact zone between the coating 9 and the plating 7 forms a very large surface for conducting an electrical current from the conductor 3 to the fusible conductor 5 and vice versa. The large conducting section is continued within the coating up close to the rim of the protection cover 8 where a soft transition exists onto the exposed core wire 5. Even cracks or microcracks existing in the deformed section 10 or immediately adjacent thereto have no detrimental effect. Even if at this point an interruption of the core wire would exist, the coating 9 would assume that current is conducted up to the place of transition onto the exposed core wire. In this way, there is no possibility of failure of the fuse by a damaged core wire in the contact zone. If by switching on and switching off loads to the fuse or through aging, additional cracks are generated or micro-cracks grow, these cracks are limited to the metallic coating 9 because at the transition from the coated core wire to the exposed core wire there exists a different crystalline structure which is a blockage for the growth of micro-cracks.

FIG. 4 shows a second embodiment of the invention for a fuse with a holder suitable for mounting by the so-called SMD-technique. As previously explained in the description of the fuse in the first embodiment described above, the base 1 supports two contact surfaces 4 between which the fusible conductor 5 extended between the surfaces for conducting an electric current. Underneath each contact surfaces 4 (i.e. on the side of the base 1 facing a printed circuit board 12) there is a soldering surface 13 which has an electric contact to the contact surface 4 with the aid of a through-connection 14. This fuse is especially suitable for the reflow mounting method in which the electrical component is placed into a soldering paste which is brushed or printed onto the printed circuit board and consecutively warmed together with the printed circuit. In FIG. 4, superfluous solder 15 is shown laterally with respect to the base 1. Consequently, the contact surface 4 and/or the soldering surface 13 may be printed on the substrate 1.

The lid 2 (formed of a plastic housing) is placed directly on the base 1 (formed of ceramic) and is affixed to the base 1 by thermal welding. Surprisingly, it has been found that a very good connection is generated between the plastic lid 2 and the ceramic base 1 by using a thermoplastic material for the lid 2. Of course, the lid 2 can be glued to the substrate if the glue is capable of sustaining the temperature load occuring during reflow soldering.

Figure 5:
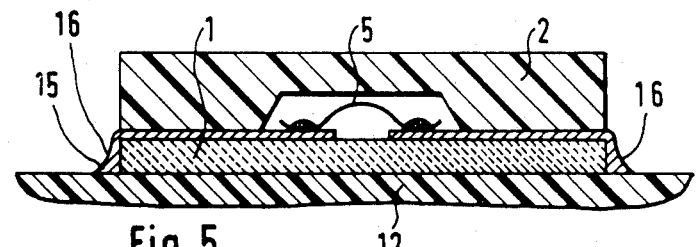
FIG. 5 shows a cross-sectional view according to FIG. 1 of the third embodiment of the invention.

FIG. 5 shows a third embodiment of the invention for a fuse with a holder suitable for mounting by the SMD-technique. This fuse is different from the previously described second embodiment in that no soldering surfaces on the underside of the substrate serving as the base are present. Here, only metallized edges 16 are present as soldering surfaces. The underside of the base 1 is ready to be glued to the printed circuit board 12 so that this embodiment is especially suitable for flow soldering.

Especially effective production can be obtained when a strip in the width of the base is metallized at edges 16 on both sides on the entire length and afterwards fusible conductors 5 for all single fuses are applied onto the strip by bonding. The metallized edges 16 can be created in various different ways. The usual way is the application of a paste which is later burnt in under temperatures of approximately 500° to 800° C. The lid 2 can finally be placed by thermal welding onto the substrate 1 and afterwards the strip sliced into single fuses for use.

Figure 6:
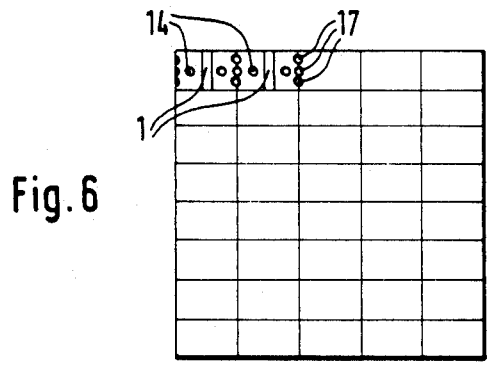
FIG. 6 shows a plane view onto a plate member consisting of several copies of fuses before separation.

FIG. 6 shows how a different kind of edge metallization 16 can be created with the aid of holes 17. During production a plate-like multi-component substrate can be used containing several copies of single fuses not only in rows but also in columns. Between two adjacent single fuses any number of holes for example three holes 17 or one oblong hole (not shown) in the length of the three shown holes 17 can be made through the substrate and through-connected in the usual way. Even on the underside of the base 1 an electric conductor does not necessarily have to be present. With the aid of through-connected holes 17 at three places respectively over a certain width of the lateral edge in an oblong hole, a metallized section is created completely sufficient for use as solder places suitable for flow-soldering. The holes 17 also serve to define a graded breaking area when slicing and separation of the single fuses take place.

In FIG. 6, the vertical and horizontal lines represent graded breaking or separating lines along which the separation can take place almost in any stage of the process. It is, of course, preferred to complete each single fuse before the separation including the application of the lid 2. This way automation is most effective. In FIG. 6, there is a further hole 14 between the discernible surfaces of the base 1 and each graded breaking line which can be used like the through-connection 14 in FIG. 4 is used.

The same substrate as base 1 can thus be used for a fuse according to the embodiment shown in FIG. 4 or the embodiment shown in FIG. 5 whereby in the latter case the through-connection is not planned or used for contact to the conductive layer of the printed circuit board 12. Of course a metallized edge 16 can also be used for a through-connection to a soldering surface 13 on the underside of the base 1 instead of or in addition to the through-connection 14. The choice of connections depends on how the fuse is soldered to its respective printed circuit board 12.

What is claimed is:

1. An electrical fuse comprising:
   two conductors having contact surfaces; and
   a fusible conductor welded or bonded onto the contact surfaces;
   the fusible conductor being completely coated by a coating;
   the welding or bonding forming contact zones between the fusible conductor and the contact surfaces; and
   the complete coating existing within the contact zones and within areas immediately adjacent to the contact zones.

2. The electrical fuse according to claim 1 wherein the contact surfaces are plated.

3. The electrical fuse according to claim 1 wherein the contact zone and adjacent areas are covered by an etchant protective layer.

4. The electrical fuse according to claim 2 wherein the contact zone and adjacent areas are covered by an etchant protective layer.

5. The electrical fuse according to claim 1 wherein the material of the coating is similar to the material of the contact surfaces.

6. The electrical fuse according to claim 2 wherein the material of the coating is similar to the material of the plating.

7. The electrical fuse according to claim 1 wherein the contact surfaces are supported by a substrate, the substrate having soldering surfaces on the side opposite from the contact surfaces, each contact surface having a through-connection to the corresponding opposite soldering surface.

8. The electrical fuse according to claim 7 wherein the contact surfaces are plated.

9. The electrical fuse according to claim 7 wherein the substrate is a ceramic substrate.

10. The electrical fuse according to claim 9 wherein the contact surfaces and/or the soldering surfaces are printed onto the substrate.

11. The electrical fuse according to claim 7 wherein the fusible conductor is covered by a plastic hood being thermally welded directly onto the substrate.

12. The electrical fuse according to claim 1 wherein the contact surfaces are attached to a substrate, the substrate having laterally metallized edges.

13. The electrical fuse according to claim 12 wherein the substrate is a ceramic substrate.

14. The electrical fuse according to claim 12 wherein the contact surfaces are printed onto the substrate.

15. The electrical fuse according to claim 12 wherein the fusible conductor is covered by a plastic hood being thermally welded directly onto the substrate.

16. A method for the manufacture of the electrical fuse of claim 1 wherein the completely coated fusible conductor is welded or bonded onto the contact surfaces thus creating contact zones, the contact zones and adjacent areas to the contact zones are covered by an etchant protective layer and the coating is etched away from the unprotected portion of the fusible conductor by an etchant forming a fusible area.

17. The method according to claim 16 wherein the etchant protective layer consists of an epoxy resin.

18. The method according to claim 16 wherein the contact surfaces are plated before the welding or bonding of the fusible conductor.

19. The method according to claim 18 wherein the coating of the fusible conductor and the plating of the contact surfaces consists essentially of aluminum or an aluminum alloy and wherein the etchant is soda lye or other suitable etchant.

20. The method according to claim 18 wherein the coating of the fusible conductor and the plating of the contact surfaces consist essentially of silver, the fusible conductor consists essentially of gold and wherein the etchant is nitric acid or other suitable etchant.

21. The method according to claim 16 wherein the overall thickness of the coated fusible conductor is maintained constant for various core wires having varying diameters.

22. The method according to claim 16 wherein the contact surfaces are arranged in pairs on the substrate and then at least one endless fusible conductor is welded or bonded onto each contact surface of each pair, a substrate fuse section carrying one pair of contact surfaces and at least one fusible conductor, the substrate fuse sections being removed from the substrate one after the other after the etching step by separating the substrate into substrate fuse sections.

23. The method according to claim 22 wherein at least one hole or an oblong hole is formed on the substrate at each border between two adjacent single substrate fuse sections carrying one pair of contact surfaces, the at least one hole or the oblong hole being metallized for providing an edge metallization and/or a graded break line.

24. The method according to claim 22 wherein each substrate fuse section supporting a pair of contact surfaces is provided on the opposite side with a pair of soldering surfaces, the soldering surfaces being through-connected to the contact surfaces.

25. The method according to claim 22 wherein the substrate forms a linear strip with pairs of contact surfaces one beside the other and wherein the lateral longitudinal edges are metallized before the welding or bonding of the fusible conductor, the metallization being in electrical conductive contact with each contact surface of the respective side.

26. The method according to claim 22 wherein each pair of contact surfaces is covered by a plastic lid which is firmly welded directly onto the substrate.

27. The method according to claim 22 wherein the number of plastic lids is equal to the number of the single substrate sections carrying one pair of contact surfaces, the plastic lids being connected to each other in the configuration of the single substrate sections and wherein each plastic lid is separated from the adjacent plastic lids during the separation together with separation of the single substrate sections.

28. The method according to claim 26 wherein the number of plastic lids is equal to the number of the single substrate sections carrying one pair of contact surfaces, the plastic lids being connected to each other in the configuration of the single substrate sections and wherein each plastic lid is separated from the adjacent plastic lids during the separation step together with separation of the single substrate fuse sections.

29. An electrical fuse comprising:
two conductors on a substrate having contact surfaces;
a fusible conductor welded or bonded onto the contact surfaces, the welding or bonding forming contact zones;
the substrate having soldering surfaces on the side opposite the contact surfaces; and
through-connections connecting each contact surface to corresponding opposite soldering surfaces.

30. The electrical fuse of claim 29,
the fusible conductor having a metallic coating selected for optimum welding or bonding to the contact surfaces.

* * * * *